United States Patent
Patel et al.

(10) Patent No.: US 10,962,388 B2
(45) Date of Patent: Mar. 30, 2021

(54) CONDUCTOR SENSING ASSEMBLIES

(71) Applicant: Apple Inc., Cupertino, CA (US)

(72) Inventors: Parin Patel, San Jose, CA (US);
Stephen Hrinya, San Jose, CA (US)

(73) Assignee: Apple Inc., Cupertino, CA (US)

( * ) Notice: Subject to any disclaimer, the term of this patent is extended or adjusted under 35 U.S.C. 154(b) by 153 days.

(21) Appl. No.: 16/123,808

(22) Filed: Sep. 6, 2018

(65) Prior Publication Data
US 2019/0101417 A1 Apr. 4, 2019

Related U.S. Application Data

(60) Provisional application No. 62/565,346, filed on Sep. 29, 2017.

(51) Int. Cl.
*G01D 5/245* (2006.01)
*G01D 5/20* (2006.01)
*H03K 17/95* (2006.01)
*G01D 5/243* (2006.01)

(52) U.S. Cl.
CPC ............ *G01D 5/245* (2013.01); *G01D 5/202* (2013.01); *H03K 17/954* (2013.01); *G01D 5/243* (2013.01)

(58) Field of Classification Search
CPC ....... G01D 5/202; G01D 5/243; H03K 17/954
See application file for complete search history.

(56) References Cited

U.S. PATENT DOCUMENTS

| | | | | |
|---|---|---|---|---|
| 4,771,359 A * | 9/1988 | Link | ................. | H03K 17/9537 361/179 |
| 6,603,306 B1 * | 8/2003 | Olsson | ................. | H03K 17/945 324/207.17 |
| 2003/0030566 A1 * | 2/2003 | Schmidt | ................ | H03K 17/954 340/686.6 |
| 2009/0219013 A1 * | 9/2009 | Hechinger | ........... | H03K 17/972 324/207.15 |
| 2011/0115717 A1 * | 5/2011 | Hable | ................. | G06F 3/04184 345/173 |
| 2013/0120053 A1 * | 5/2013 | Mei | ..................... | G06F 3/04184 327/517 |

OTHER PUBLICATIONS

Texas Instruments, "Application Report—LDC Target Design." Sep. 2016, 12 pages.
Texas Instruments, "LDC0851 Differential Inductive Switch." Dec. 2015 (revised Jan. 2016), 39 pages.

\* cited by examiner

*Primary Examiner* — Alvaro E Fortich
(74) *Attorney, Agent, or Firm* — Kubota & Basol LLP

(57) ABSTRACT

An electronic device may include a conductor sensing assembly for sensing movement of a conductor, for example, in order to provide an input assembly that may be operative to detect a user's manipulation of a distance between the conductor and a portion of the conductor sensing assembly for controlling a functionality of the device. The conductor sensing assembly may include an oscillator that may produce oscillations that decay at different rates dependent upon a variable distance between a component of the conductor sensing assembly and a conductor of the input assembly. As the decay rate may be dependent on or otherwise correlate with the magnitude of a distance between the oscillator and a conductor, detection of the decay rate of the oscillator may enable determination of a state of a button input assembly that includes a conductor operative to be movable by a user with respect to the oscillator.

26 Claims, 8 Drawing Sheets

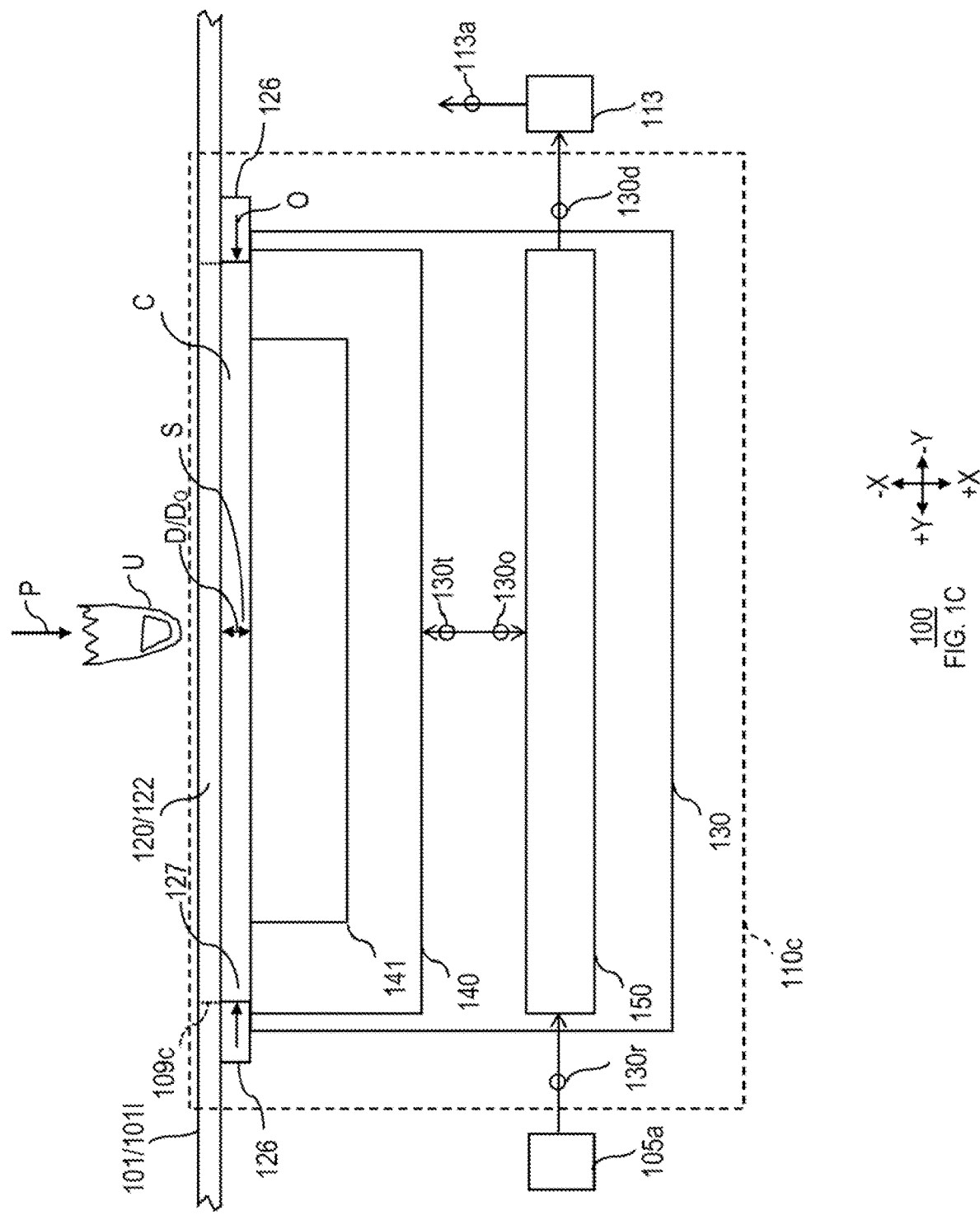

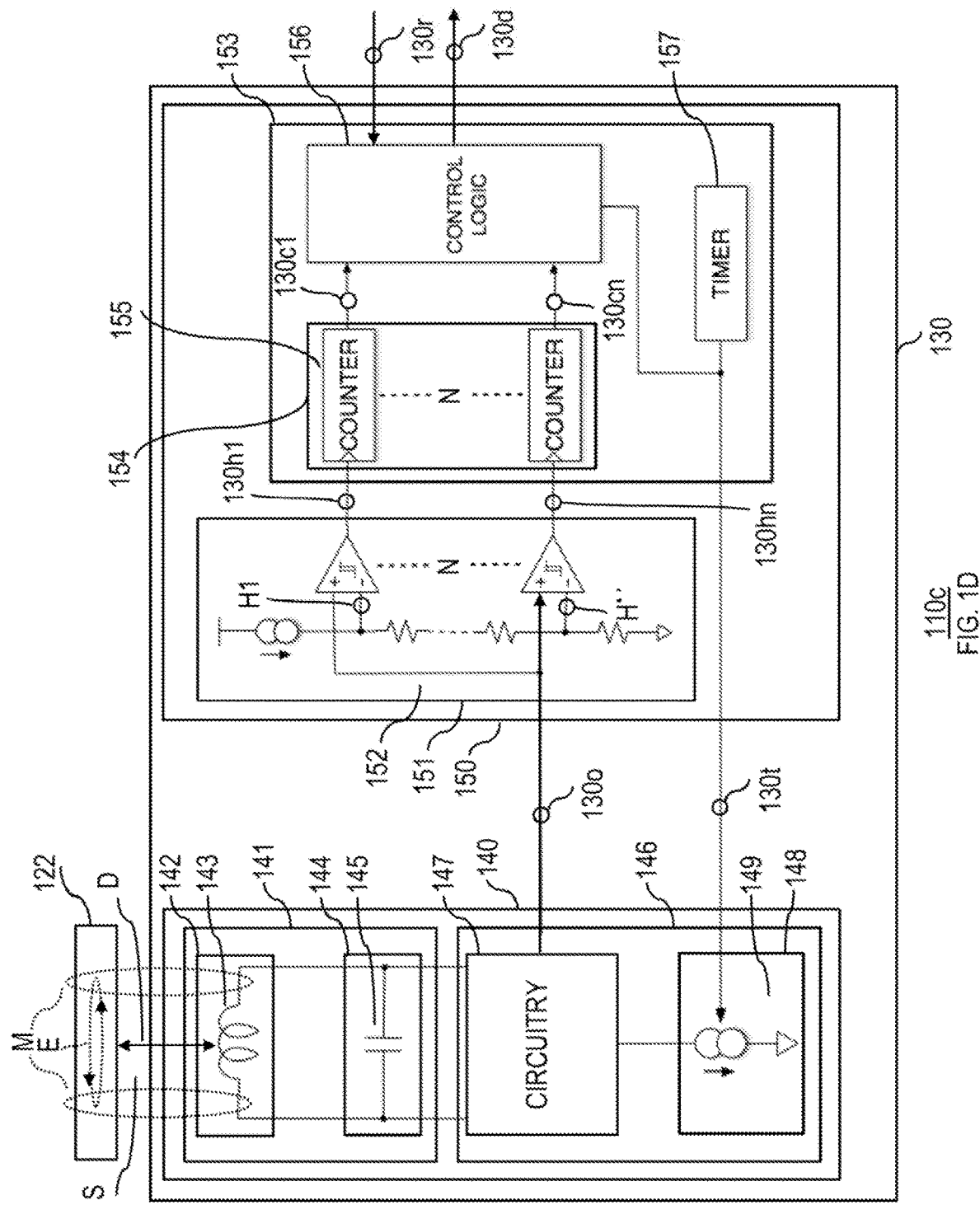

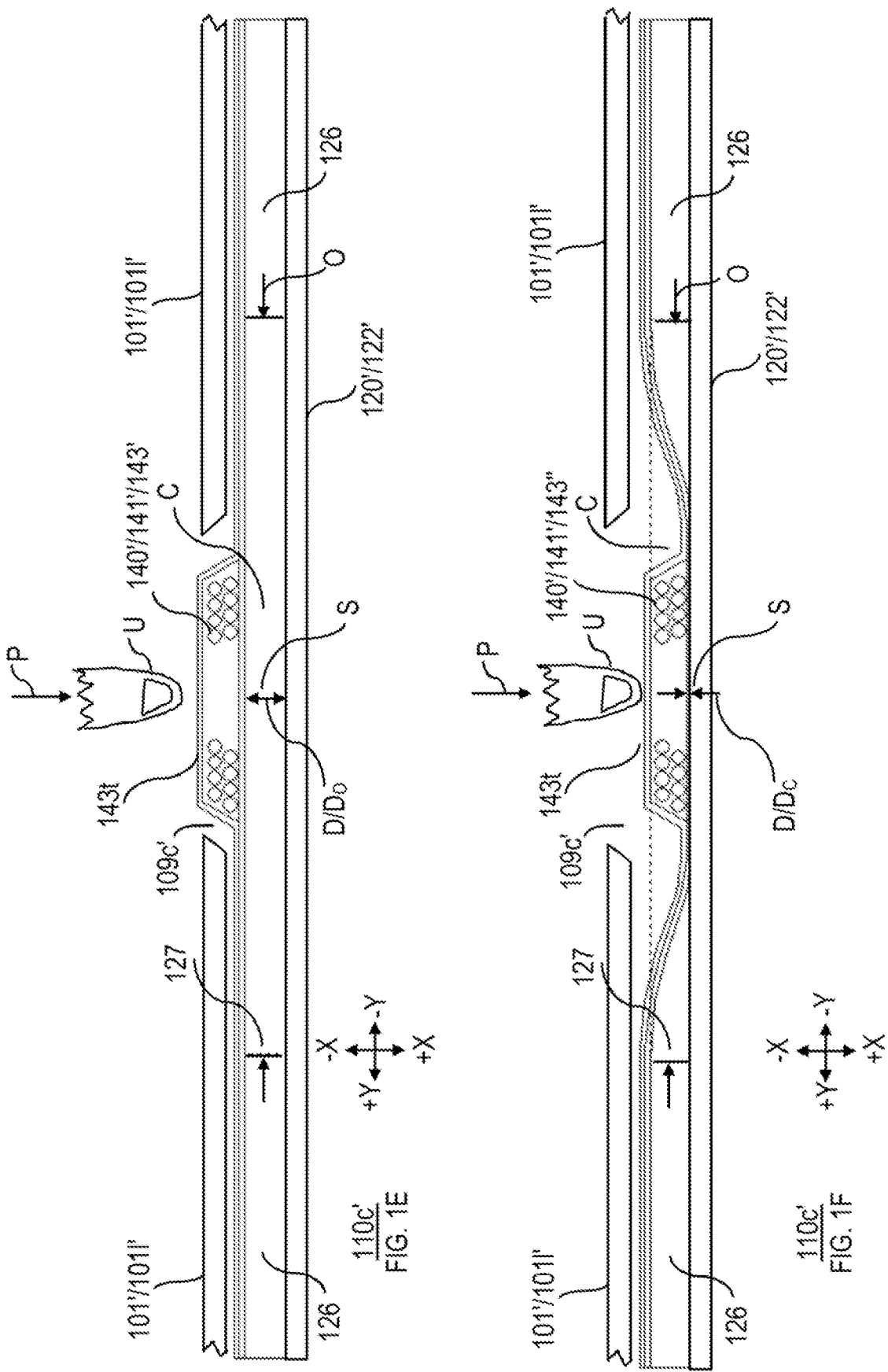

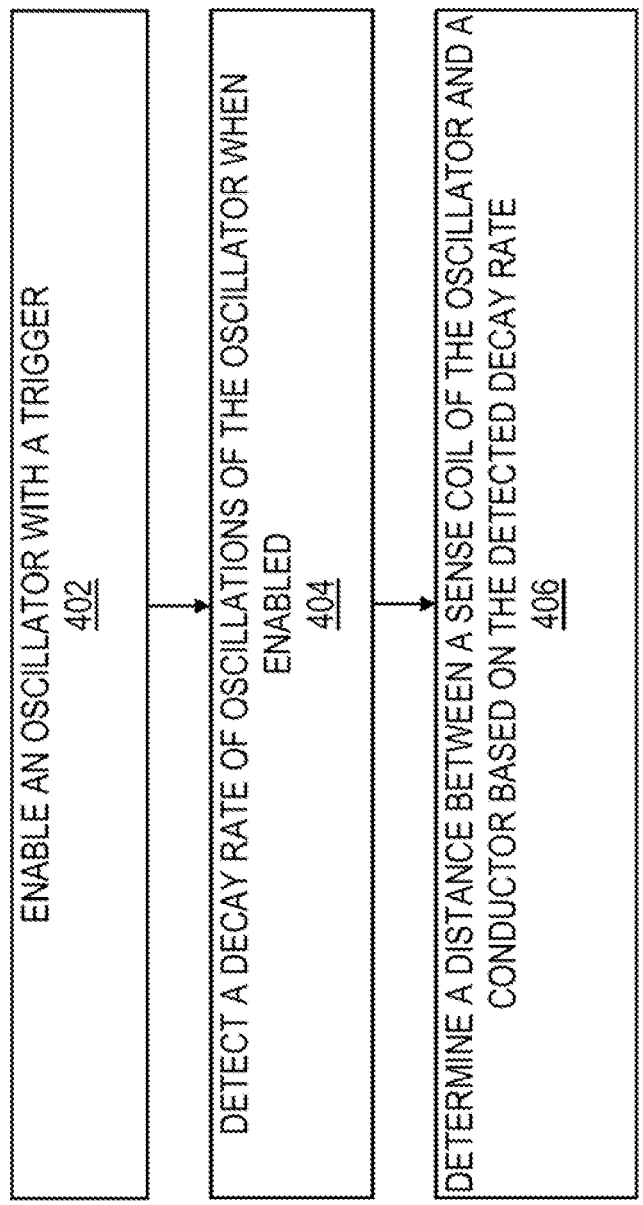

CONDUCTOR SENSING ASSEMBLIES

CROSS-REFERENCE TO RELATED APPLICATION(S)

This application claims the benefit of prior filed U.S. Provisional Patent Application No. 62/565,346, filed Sep. 29, 2017, which is hereby incorporated by reference herein in its entirety.

TECHNICAL FIELD

This disclosure relates to conductor sensing assemblies and, more particularly, to conductor sensing assemblies that detect movement of a conductor using a decay rate of an oscillator.

BACKGROUND OF THE DISCLOSURE

An electronic device (e.g., a laptop computer, a cellular telephone, etc.) may be provided with an input assembly that generates an input control based on the detected movement of an input assembly. However, heretofore, such input assemblies have required many electronic components and/or consumed a significant amount of power.

SUMMARY OF THE DISCLOSURE

This document describes systems, methods, and computer-readable media for detecting movement of a conductor using a decay rate of an oscillator.

For example, a method is provided for sensing a conductor using an oscillator, wherein the method may include enabling the oscillator with a trigger burst window of a trigger interval, detecting a number of oscillation cycles in the trigger interval, and determining a distance between the conductor and the oscillator based on the detected number of oscillation cycles.

As another example, a method is provided for sensing a conductor using an oscillator, wherein the method may include enabling the oscillator with a trigger, detecting a decay rate of oscillations of the oscillator when enabled, and determining a distance between the conductor and a sense coil of the oscillator based on the detected decay rate.

This Summary is provided only to summarize some example embodiments, so as to provide a basic understanding of some aspects of the subject matter described in this document. Accordingly, it will be appreciated that the features described in this Summary are only examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

The discussion below makes reference to the following drawings, in which like reference characters may refer to like parts throughout, and in which:

FIG. 1C is a cross-sectional view, taken from line IC-IC of FIG. 1A, of a portion of the electronic device of FIGS. 1-1B with a button input assembly with at least a portion of the conductor sensing assembly, in accordance with some embodiments;

FIG. 1D is an exemplary schematic view of the button input assembly with the conductor sensing assembly of FIG. 1C, in accordance with some embodiments;

FIG. 1E is a cross-sectional view, similar to FIG. 1C, of a portion of another button input assembly with at least a portion of a conductor sensing assembly, in a first input state, in accordance with some embodiments;

FIG. 1F is a cross-sectional view, similar to FIGS. 1C and 1E, of the portion of the other button input assembly of FIG. 1E, in a second input state, in accordance with some embodiments;

FIGS. 3 and 4 are flowcharts of illustrative processes for sensing a conductor.

DETAILED DESCRIPTION OF THE DISCLOSURE

Systems, methods, and computer-readable media may be provided for detecting movement of a conductor. An electronic device may include a conductor sensing assembly for sensing movement of a conductor, for example, in order to provide an input assembly that may be operative to detect a user's manipulation of a distance between the conductor and a portion of the conductor sensing assembly for controlling a functionality of the electronic device. As an example, such a conductor sensing assembly may include an oscillator that may be configured to produce oscillations that decay at different rates dependent upon a variable distance between a component of the conductor sensing assembly and a conductor of the input assembly. Such an oscillator may be provided as an LC oscillator that may be configured to produce oscillations that are damped at a varying rate based on a varying distance between a sense coil (e.g., an inductor) of the LC oscillator and a conductor (e.g., a conductive metal plate), where the conductor may be manipulated (e.g., pressed, deflected, etc.) by a user of the electronic device towards the sense coil to shorten such a distance, and the conductor sensing assembly may be operative to sense such manipulation by detecting a particular oscillation decay rate. As a decay rate of oscillations of an oscillator may be dependent on or otherwise correlate with the magnitude of a distance between the oscillator and a conductor, detection of the decay rate of the oscillator may enable determination of a state of a button input assembly that includes the conductor operative to be movable by a user with respect to the oscillator.

Figure 1:
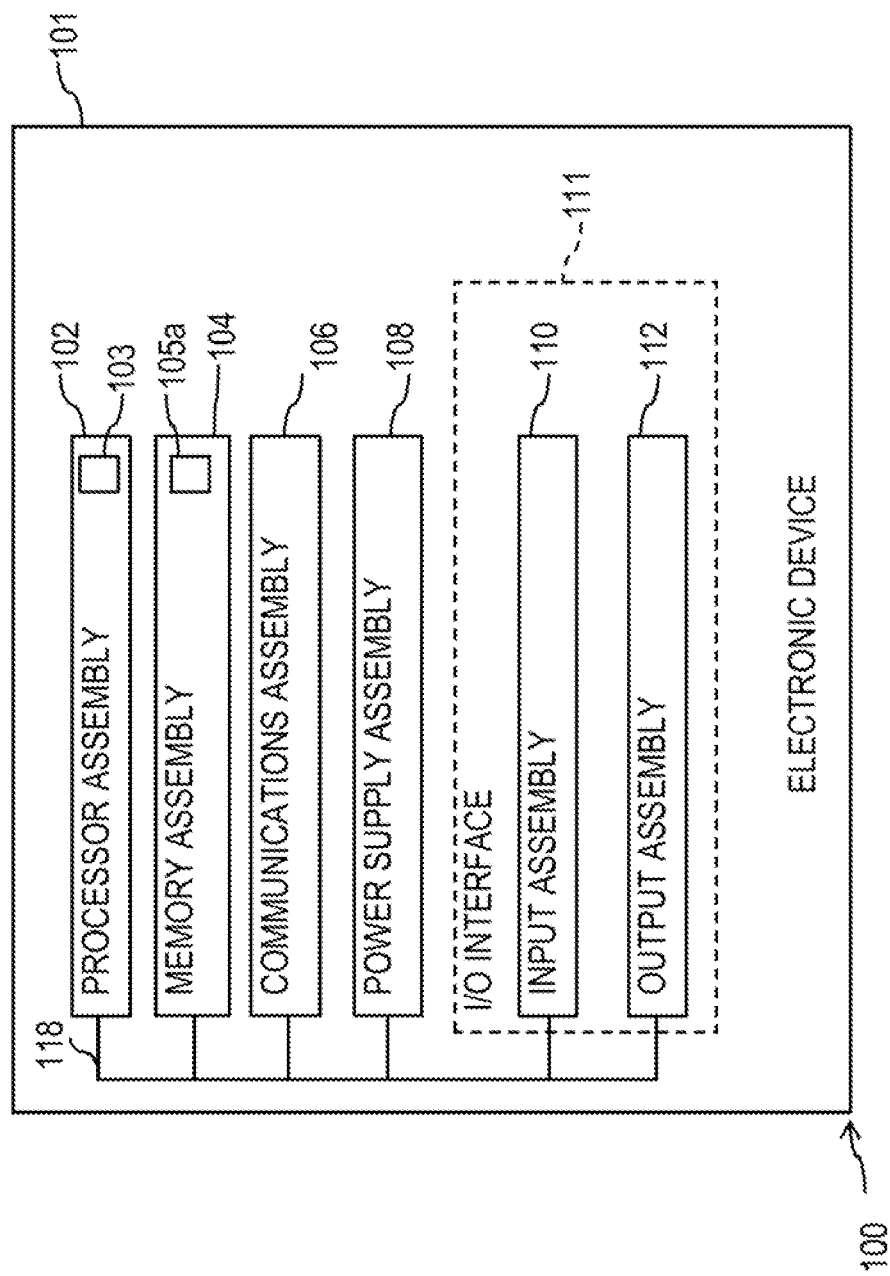
FIG. 1 is a schematic view of an illustrative system including an electronic device with a conductor sensing assembly.

FIG. 1 is a schematic view of an illustrative electronic device 100 that may include a conductor sensing assembly. Electronic device 100 can include, but is not limited to, a music player (e.g., an iPod™ available by Apple Inc. of Cupertino, Calif.), video player, still image player, game player, other media player, music recorder, movie or video camera or recorder, still camera, other media recorder, radio, medical equipment, domestic appliance, transportation vehicle instrument, musical instrument, calculator, cellular telephone (e.g., an iPhone™ available by Apple Inc.), other wireless communication device, wearable device (e.g., an Apple Watch™ available by Apple Inc.), personal digital assistant, remote control, pager, computer (e.g., a desktop (e.g., an iMac™ available by Apple Inc.), laptop (e.g., a MacBook™ available by Apple Inc.), tablet (e.g., an iPad™ available by Apple Inc.), server, etc.), monitor, television, stereo equipment, set up box, set-top box, boom box, modem, router, printer, or any combination thereof. In some embodiments, electronic device 100 may perform a single function (e.g., a device dedicated to sensing a conductor) and, in other embodiments, electronic device 100 may perform multiple functions (e.g., a device that senses a conductor, plays music, and receives and transmits telephone calls).

Electronic device 100 may be any portable, mobile, hand-held, or miniature electronic device that may be configured to sense a conductor (e.g., of an input assembly) wherever a user travels. Some miniature electronic devices may have a form factor that is smaller than that of hand-held electronic devices, such as an iPod™. Illustrative miniature electronic devices can be integrated into various objects that may include, but are not limited to, watches (e.g., an Apple Watch™ available by Apple Inc.), rings, necklaces, belts, accessories for belts, headsets, accessories for shoes, virtual reality devices, glasses, other wearable electronics, accessories for sporting equipment, accessories for fitness equipment, key chains, or any combination thereof. Alternatively, electronic device 100 may not be portable at all, but may instead be generally stationary.

As shown in FIG. 1, for example, electronic device 100 may include a processor assembly 102, memory assembly 104, a communications assembly 106, a power supply assembly 108, an input assembly 110, and an output assembly 112. Electronic device 100 may also include a bus 118 that may provide one or more wired or wireless communication links or paths for transferring data and/or power to, from, or between various assemblies of device 100. In some embodiments, one or more assemblies of electronic device 100 may be combined or omitted. Moreover, electronic device 100 may include any other suitable assemblies not combined or included in FIG. 1 and/or several instances of the assemblies shown in FIG. 1. For the sake of simplicity, only one of each of the assemblies is shown in FIG. 1.

Memory assembly 104 may include one or more storage mediums, including for example, a hard-drive, flash memory, permanent memory such as read-only memory ("ROM"), semi-permanent memory such as random access memory ("RAM"), any other suitable type of storage assembly, or any combination thereof. Memory assembly 104 may include cache memory, which may be one or more different types of memory used for temporarily storing data for electronic device applications. Memory assembly 104 may be fixedly embedded within electronic device 100 or may be incorporated onto one or more suitable types of components that may be repeatedly inserted into and removed from electronic device 100 (e.g., a subscriber identity module ("SIM") card or secure digital ("SD") memory card). Memory assembly 104 may store media data (e.g., music and image files), software (e.g., for implementing functions on device 100), firmware, preference information (e.g., media playback preferences), lifestyle information (e.g., food preferences), exercise information (e.g., information obtained by exercise monitoring equipment), transaction information (e.g., credit card information), wireless connection information (e.g., information that may enable device 100 to establish a wireless connection), subscription information (e.g., information that keeps track of podcasts or television shows or other media a user subscribes to), contact information (e.g., telephone numbers and e-mail addresses), calendar information, pass information (e.g., transportation boarding passes, event tickets, coupons, store cards, financial payment cards, etc.), any suitable oscillation count-distance correlator data of any suitable conductor sensing assembly of device 100 (e.g., as may be stored in a correlator memory portion 105a of memory assembly 104), any other suitable data, or any combination thereof.

Communications assembly 106 may be provided to allow device 100 to communicate with one or more other electronic devices or servers or any other remote entities using any suitable communications protocol(s). For example, communications assembly 106 may support Wi-Fi™ (e.g., an 802.11 protocol), ZigBee™ (e.g., an 802.15.4 protocol), WiDi™, Ethernet, Bluetooth™, Bluetooth™ Low Energy ("BLE"), high frequency systems (e.g., 900 MHz, 2.4 GHz, and 5.6 GHz communication systems), infrared, transmission control protocol/internet protocol ("TCP/IP") (e.g., any of the protocols used in each of the TCP/IP layers), Stream Control Transmission Protocol ("SCTP"), Dynamic Host Configuration Protocol ("DHCP"), hypertext transfer protocol ("HTTP"), BitTorrent™, file transfer protocol ("FTP"), real-time transport protocol ("RTP"), real-time streaming protocol ("RTSP"), real-time control protocol ("RTCP"), Remote Audio Output Protocol ("RAOP"), Real Data Transport Protocol™ ("RDTP"), User Datagram Protocol ("UDP"), secure shell protocol ("SSH"), wireless distribution system ("WDS") bridging, any communications protocol that may be used by wireless and cellular telephones and personal e-mail devices (e.g., Global System for Mobile Communications ("GSM"), GSM plus Enhanced Data rates for GSM Evolution ("EDGE"), Code Division Multiple Access ("CDMA"), Orthogonal Frequency-Division Multiple Access ("OFDMA"), high speed packet access ("HSPA"), multi-band, etc.), any communications protocol that may be used by a low power Wireless Personal Area Network ("6LoWPAN") module, any other communications protocol, or any combination thereof. Communications assembly 106 may also include or may be electrically coupled to any suitable transceiver circuitry that can enable device 100 to be communicatively coupled to another device (e.g., a server, host computer, scanner, accessory device, etc.) and communicate data with that other device wirelessly or via a wired connection (e.g., using a connector port). Communications assembly 106 may be configured to determine a geographical position of electronic device 100 and/or any suitable data that may be associated with that position. For example, communications assembly 106 may utilize a global positioning system ("GPS") or a regional or site-wide positioning system that may use cell tower positioning technology or Wi-Fi™ technology, or any suitable location-based service or real-time locating system, which may leverage a geo-fence for providing any suitable location-based data to device 100.

Power supply assembly 108 may include any suitable circuitry for receiving and/or generating power, and for providing such power to one or more of the other assemblies of electronic device 100. For example, power supply assembly 108 can be coupled to a power grid (e.g., when device 100 is not acting as a portable device or when a battery of the device is being charged at an electrical outlet with power generated by an electrical power plant). As another example, power supply assembly 108 may be configured to generate power from a natural source (e.g., solar power using solar cells). As another example, power supply assembly 108 can include one or more batteries for providing power (e.g., when device 100 is acting as a portable device). For example, power supply assembly 108 can include one or more of a battery (e.g., a gel, nickel metal hydride, nickel cadmium, nickel hydrogen, lead acid, or lithium-ion battery), an uninterruptible or continuous power supply assembly ("UPS" or "CPS"), and circuitry for processing power received from a power generation source (e.g., power generated by an electrical power plant and delivered to the user via an electrical socket or otherwise). The power can be provided by power supply assembly 108 as alternating current or direct current, and may be processed to transform power or limit received power to particular characteristics. For example, the power can be transformed to or from direct current, and constrained to one or more values of average power, effective power, peak power, energy per pulse, voltage, current (e.g., measured in amperes), or any other characteristic of received power. Power supply assembly 108 can be operative to request or provide particular amounts of power at different times, for example, based on the needs or requirements of electronic device 100 or periphery devices that may be coupled to electronic device 100 (e.g., to request more power when charging a battery than when the battery is already charged).

One or more input assemblies 110 may be provided to permit a user or device environment to interact or interface with device 100. For example, input assembly 110 can take a variety of forms, including, but not limited to, a touch pad, dial, click wheel, scroll wheel, touch screen, one or more buttons (e.g., a keyboard), mouse, joy stick, track ball, microphone, camera, scanner (e.g., a barcode scanner or any other suitable scanner that may obtain product identifying information from a code, such as a linear barcode, a matrix barcode (e.g., a quick response ("QR") code), or the like), proximity sensor, light detector, temperature sensor, motion sensor, biometric sensor (e.g., a fingerprint reader or other feature (e.g., facial) recognition sensor, which may operate in conjunction with a feature-processing application that may be accessible to electronic device 100 for authenticating a user), line-in connector for data and/or power, and combinations thereof. Each input assembly 110 can be configured to provide one or more dedicated control functions for making selections or issuing commands associated with operating device 100. Each input assembly 110 may be positioned at any suitable location at least partially within a space defined by a housing 101 of device 100 and/or at least partially on an external surface of housing 101 of device 100.

Electronic device 100 may also include one or more output assemblies 112 that may present information (e.g., graphical, audible, and/or tactile information) to a user of device 100. For example, output assembly 112 of electronic device 100 may take various forms, including, but not limited to, audio speakers, headphones, line-out connectors for data and/or power, visual displays (e.g., for transmitting data via visible light and/or via invisible light), infrared ports, flashes (e.g., light sources for providing artificial light for illuminating an environment of the device), tactile/haptic outputs (e.g., rumblers, vibrators, etc.), and combinations thereof. As a specific example, electronic device 100 may include a display assembly output assembly as output assembly 112, where such a display assembly output assembly may include any suitable type of display or interface for presenting visual data to a user with visible light.

It is noted that one or more input assemblies and one or more output assemblies may sometimes be referred to collectively herein as an input/output ("I/O") assembly or I/O interface (e.g., input assembly 110 and output assembly 112 as I/O assembly or I/O interface 111). For example, input assembly 110 and output assembly 112 may sometimes be a single I/O interface 111, such as a touch screen, that may receive input information through a user's touch of a display screen and that may also provide visual information to a user via that same display screen.

Processor assembly 102 of electronic device 100 may include any processing circuitry that may be operative to control the operations and performance of one or more assemblies of electronic device 100. For example, processor assembly 102 may receive input signals from input assembly 110 and/or drive output signals through output assembly 112. As shown in FIG. 1, processor assembly 102 may be used to run one or more applications, such as an application 103. Application 103 may include, but is not limited to, one or more operating system applications, firmware applications, media playback applications, media editing applications, pass applications, calendar applications, state determination applications, biometric feature-processing applications, compass applications, health applications, thermometer applications, weather applications, thermal management applications, video game applications, or any other suitable applications. For example, processor assembly 102 may load application 103 as a user interface program to determine how instructions or data received via an input assembly 110 and/or any other assembly of device 100 may manipulate the one or more ways in which information may be stored on device 100 and/or provided to the a via an output assembly 112. As another example, processor assembly 102 may load application 103 as a background application program or a user-detectable application program to determine how input assembly output data received via any suitable assembly and/or combination of assemblies of device 100 (e.g., input assembly output data determined by a conductor sensing subassembly of an input assembly 110 based on a decay rate of an oscillator and any suitable oscillation count-distance correlator data) may be stored and/or otherwise used to control or manipulate at least one functionality of device 100 (e.g., a performance or mode of electronic device 100 may be altered in a particular one of various ways (e.g., volume of an audio output assembly may be lowered or muted) based on a particular type of received input assembly output data). Application 103 may be accessed by processor assembly 102 from any suitable source, such as from memory assembly 104 (e.g., via bus 118) or from another remote device or server (e.g., via communications assembly 106). Processor assembly 102 may include a single processor or multiple processors. For example, processor assembly 102 may include at least one "general purpose" microprocessor, a combination of general and special purpose microprocessors, instruction set processors, graphics processors, video processors, and/or related chips sets, and/or special purpose microprocessors. Processor assembly 102 also may include on board memory for caching purposes.

Electronic device 100 may also be provided with housing 101 that may at least partially enclose at least a portion of one or more of the assemblies of device 100 for protection from debris and other degrading forces external to device 100. In some embodiments, one or more of the assemblies may be provided within its own housing (e.g., input assembly 110 may be an independent keyboard or mouse within its own housing that may wirelessly or through a wire communicate with processor assembly 102, which may be provided within its own housing).

Figure 1A:
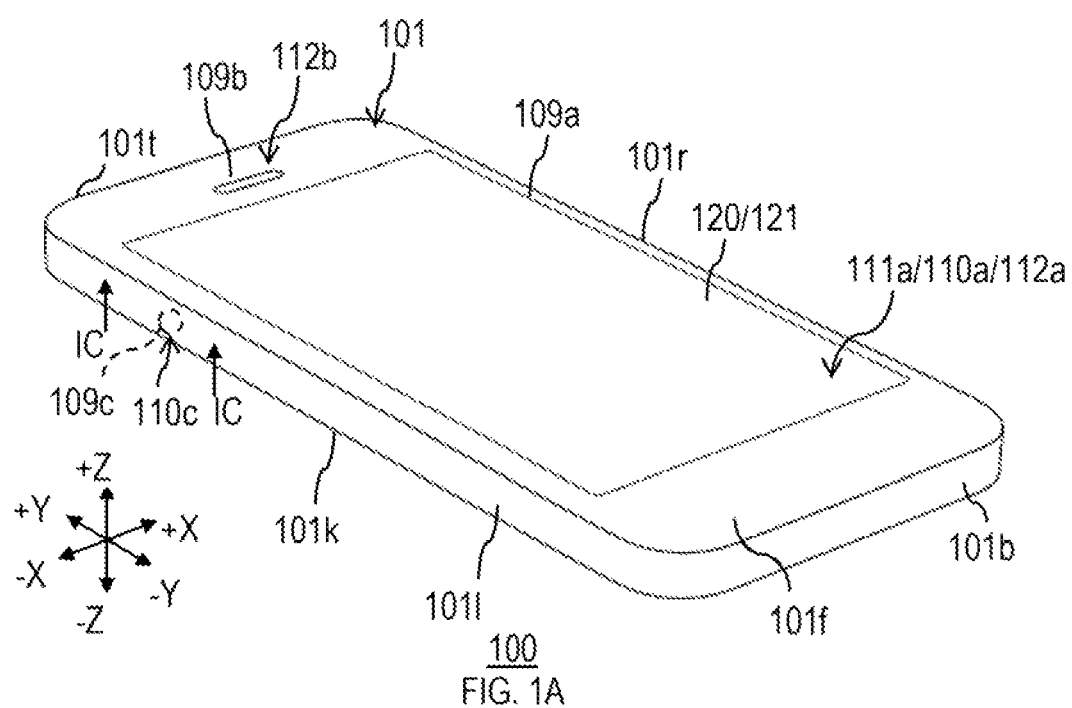
FIG. 1A is a front, left, bottom perspective view of the electronic device of FIG. 1, in accordance with some embodiments.
Figure 1B:
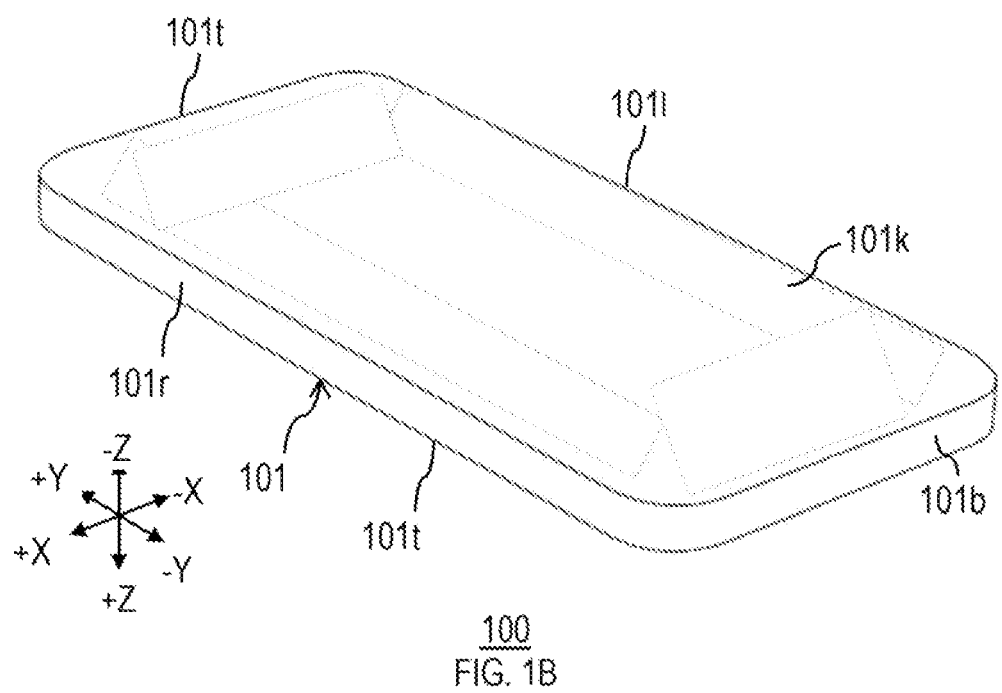
FIG. 1B is a back, right, bottom perspective view of the electronic device of FIGS. 1 and 1A, in accordance with some embodiments.

FIGS. 1A-1D are various views of various portions of electronic device 100 in accordance with some embodiments. As shown, electronic device 100 may include a touch screen I/O interface 111a, which may include a touch input assembly 110a and a display output assembly 112a, an audio speaker output assembly 112b, and a button input assembly 110c, and where housing 101 may be configured to at least partially enclose each of the input assemblies and output assemblies of device 100. Housing 101 may be any suitable shape and may include any suitable number of walls. In some embodiments, as shown in FIGS. 1A-ID, for example, housing 101 may be of a generally hexahedral shape and may include a top wall 101t, a bottom wall 101b that may be opposite top wall 101t, a left wall 101l, a right wall 101r that may be opposite left wall 101l, a front wall 101f, and a back wall 101k that may be opposite front wall 101f, where at least a portion of touch screen I/O interface 111a may be at least partially exposed to the external environment via a housing opening 109a through front wall 101f, where at least a portion of audio speaker assembly output assembly 112b may be at least partially exposed to the external environment via a housing opening 109b through front wall 101f, and where at least a portion of button input assembly 110c may be at least partially exposed to the external environment by a housing portion 109c of left wall 101l (or via an opening through wall 101l (see, e.g., FIGS. 1E and 1F)). It is to be understood that electronic device 100 may be provided with any suitable size or shape with any suitable number and type of assemblies or components other than as shown in FIGS. 1A-1D, and that the embodiments of FIGS. 1A-1D are only exemplary.

As shown in FIG. 1C, button input assembly 110c may include a conductor assembly 120, a spacer assembly 126, and a conductor sensing (or sensor) assembly 130. Sensor assembly 130 may be configured to detect various types of movement of a conductor component structure (or conductor) 122 of conductor assembly 120 with respect to sensor assembly 130. For example, sensor assembly 130 may be configured to detect various types of adjustment of a magnitude of a distance dimension D of a spacing S between conductor 122 and a portion of conductor assembly 130 (e.g., to detect various magnitudes of dimension D). Such various adjustment types may be made by a user U interacting with button input assembly 110c in various ways, such as by user U pushing conductor 122 towards sensor assembly 130 for reducing dimension D of spacing S by initiating the application of, or increasing the magnitude of, a user force on conductor 122 in the direction of arrow P), by user U enabling conductor 122 to retreat from sensor assembly 130 for increasing dimension D of spacing S (e.g., by terminating the application of, or decreasing the magnitude of, a user force on conductor 122), or by user U maintaining a position of conductor 122 with respect to sensor assembly 130 (e.g., by maintaining a particular user force on conductor 122 or by continuing not to provide any user force or even any user contact on conductor 122). Moreover, sensor assembly 130 may be configured to generate various types of input assembly output data 130d, where different types of input assembly output data 130d may correspond to different input states of button input assembly 110c (e.g., to different detected magnitudes of dimension D), and where such different types of input assembly output data 130d may be of any suitable use by any suitable receiving element 113 of device 100 (e.g., an active application 103 of device 100) for adjusting any suitable functionality of any suitable assembly of device 100 in different ways (e.g., for performing an adjustment 113a of a functionality of device 100 (e.g., for decreasing or muting the volume of audio emitted by audio speaker output assembly 112b)).

Sensor assembly 130 may include an oscillator subassembly 140 and a processor subassembly 150. Oscillator subassembly 140 may be configured to be enabled by any suitable (e.g., periodic) trigger to produce oscillations (e.g., sensor assembly oscillation data 130o) that may decay at a variable rate dependent upon a variable magnitude of distance dimension D of spacing S between conductor 122 of conductor assembly 120 and a portion of oscillator subassembly 140, such as a resonator subassembly 141 of oscillator subassembly 140. For example, as shown in FIG. 1C, sensor assembly trigger data 130t (e.g., a periodic trigger voltage) may be provided by processor subassembly 150 for enabling oscillator subassembly 140 to produce sensor assembly oscillation data 130o (e.g., an oscillatory voltage indicative of oscillations of oscillator subassembly 140), and such oscillation data 130o may be received and processed by processor subassembly 150 to determine a particular oscillation decay rate of the oscillations of oscillator subassembly 140. Such a determined decay rate may be indicative of a particular input state of button input assembly 110c (e.g., indicative of a particular magnitude of dimension D) and processor subassembly 150 may be configured to generate and communicate to receiving element 113 a particular type of input assembly output data 130d that may be indicative of such a particular input state of button input assembly 110c.

Spacer assembly 126 may be provided for enabling any suitable magnitude $D_O$ of a resting stable input state dimension of dimension D of spacing S between conductor 122 and resonator subassembly 141 of oscillator subassembly 140 when button input assembly 110c is in an initial stable state (e.g., when no user force is applied by user U to conductor 122 such that button input assembly 110c may be in a resting stable input state (e.g., as shown in FIG. 1C)). As just one example, conductor 122 of conductor assembly 120 may be provided by housing portion 109c of wall 101l of housing 101 (e.g., a metal or any other suitable conductive portion of housing 101), and spacer assembly 126 may provide a spacer structure with a thickness $D_O$ that may be positioned between wall 101l and any suitable portion (e.g., subassembly 141) of oscillator subassembly 140, and any suitable spacer opening 127 may be provided through the structure of spacer assembly 126 for exposing conductor 122 to resonator subassembly 141. For example, opening 127 may be any suitable geometry, such as a cylinder with a diameter O and a height $D_O$ for defining a spacer volume C within which at least a portion of conductor 122 and/or at least a portion of resonator subassembly 141 may move (e.g., within which at least a portion of conductor 122 may be deflected or otherwise manipulated) for adjusting the magnitude of dimension D of spacing S between conductor 122 and resonator subassembly 141. At least a portion of oscillator subassembly 140 and conductor assembly 120 may each be fixed to spacer assembly 126 for enabling spacer volume C to be provided in a static relationship with respect to at least that portion of oscillator subassembly 140 and conductor assembly 120 (e.g., at least in a stable state of input assembly 110c). In one particular embodiment, the spacer structure of spacer assembly 126 may be a portion of wall 101l of housing 101, where opening 127 may be provided to form a reduced thickness portion 109c of housing 101 for providing a type of conductor 122 that may be more easily moved (e.g., deflected) with respect to oscillator subassembly 140 within spacer volume C for adjusting the magnitude of dimension D therebetween. In another embodiment, the spacer structure of spacer assembly 126 may be provided by any other suitable material, such as a heavy paper stock. Magnitude $D_O$ of the height of the spacer structure of spacer assembly 126 and/or of dimension D of spacing S when button input assembly 110c is in a resting stable state may be any suitable magnitude, such as about 250 micrometers or may be in any suitable range, such as between 100 micrometers and 400 micrometers, while diameter O may be any suitable magnitude, such as about 1,000 micrometers or may be in any suitable range, such as between 500 micrometers and 1,500 micrometers. In some embodiments, rather than button input assembly 110c being configured such that a user U may be enabled to provide a force for moving at least a portion of conductor 122 into spacer volume C towards oscillator subassembly 140 in order to adjust the magnitude of dimension D of spacing S therebetween (e.g., as shown in FIG. 1C), a button input assembly 110c', as shown in FIGS. 1E and 1F, for example, may be configured such that a user U may be enabled to provide a force (e.g., in the direction P) for moving at least a portion of an oscillator subassembly 140' (e.g., at least a portion of a resonator subassembly 141' that may include one or more windings of an inductor or sense coil 143' surrounded by a protective layer 143t (e.g., a polyimide film or tape)) into spacer volume C defined by opening 127 of spacer assembly 126 towards a conductor 122' of a conductor assembly 120' in order to adjust the magnitude of dimension D of spacing S therebetween. For example, as shown, button input assembly 110c' may be adjusted from a first state of FIG. 1E, in which user U exerts no force on oscillator subassembly 140' such that at least a portion of oscillator subassembly 140' (e.g., inductor or sense coil 143') may be held (e.g., by spacer assembly 126) at a magnitude $D_O$ of dimension D of spacing S with respect to conductor 122', to a second state of FIG. 1F, in which user U exerts a force on at least a portion of oscillator subassembly 140' (e.g., in the direction of arrow P) such that a portion of oscillator subassembly 140' (e.g., inductor or sense coil 143') may move (e.g., deflect) within spacer volume C (e.g., via a housing opening 109c' through wall 101l' of a device housing 101') and may be held (e.g., at least partially within spacer volume C) at a magnitude $D_C$ of dimension D of spacing S with respect to conductor 122', where magnitude $D_C$ may be 0 millimeters or substantially 0 millimeters such that a portion of oscillator subassembly 140 (e.g., sense coil 143') may be contacting or substantially contacting a portion of conductor 122' (e.g., as shown) or at any other magnitude between magnitude $D_C$ and magnitude $D_O$ (e.g., magnitude $D_M$ of FIG. 2). Additionally or alternatively, in yet other embodiments, button input assembly 110c may be configured such that a user U may be enabled to provide a first force for moving at least a portion of oscillator subassembly 140 (e.g., at least a portion of subassembly 141) into spacer volume C towards conductor 122 and a second force for moving at least a portion of conductor 120 into spacer volume C towards at least a portion of oscillator subassembly 140 (e.g., at least a portion of subassembly 141) in order to adjust the magnitude of dimension D of spacing S therebetween.

When sensor assembly trigger data 130t may be provided by processor subassembly 150 for enabling oscillator subassembly 140 to produce sensor assembly oscillation data 130o, processor subassembly 150 may be configured to compare such oscillation data 130o to at least one threshold in order to determine the number of oscillation cycles whose amplitude exceeds that threshold, where such a determined cycle count for a particular threshold may be processed by processor subassembly 150 to determine a decay rate of the oscillations and/or a measure of a Q factor (e.g., resonator Q) of oscillator subassembly 140, which may be used by processor subassembly 150 to infer the magnitude of dimension D of spacing S for generating appropriate input assembly output data 130d. As shown in FIG. 1D, for example, oscillator subassembly 140 may be configured to provide any suitable oscillator, such as any suitable harmonic oscillator and/or relaxation oscillator, and may include resonator subassembly 141 (e.g., any suitable feedback network, such as an inductor-capacitor ("LC") circuit, a resonant circuit, a tank circuit, a tuned circuit, etc.) and an amplifier subassembly 146 that may be coupled to resonator subassembly 141 in any suitable manner (e.g., amplifier subassembly 146 may be coupled in a feedback loop with its output fed back into its input through resonator subassembly 141 to provide positive feedback). Resonator subassembly 141 may be configured to include any suitable first resonator module 142 and any suitable second resonator module 144 coupled to first resonator module 142 for providing any suitable resonating network. As shown in FIG. 1D, for example, in a particular embodiment, first resonator module 142 may be configured to include an inductor 143 (e.g., a sense coil) and second resonator module 144 may be configured to include a capacitor 145 (e.g., a resonator capacitor), such that resonator subassembly 141 may be configured to provide an LC tank circuit. For example, in some embodiments, resonator subassembly 141 may include a coil (inductor) (e.g., first resonator module 142) that may be located proximate to conductor 122 so that magnetic field lines from the coil may enter the conductor when conductor 122 is at a minimum extreme spacing. Spacing S may be between the inductive element in the oscillator and the conductor. The oscillator may include an amplifier with a bias source and a resonator (e.g., capacitor plus inductor). The position of the inductor with respect to the conductor may be of interest, as the magnetic field from the inductor may interact with the conductor. The coil (inductor) of the oscillator subassembly may be positioned proximate to the conductor, while other portions (e.g., the remainder) of the oscillator assembly may be positioned further from the conductor. Amplifier subassembly 146 may be configured to include any suitable first amplifier subassembly 147 and any suitable second amplifier subassembly 148 coupled to first amplifier subassembly 146 for providing any suitable oscillator amplifier. For example, first amplifier subassembly 147 may be configured to include any suitable circuitry for configuring oscillator subassembly 140 to provide any suitable type of oscillator, including, but not limited to, a Colpitts oscillator, a Hartley oscillator, a Clapp oscillator, and/or the like, and/or to provide sensor assembly oscillation data 130o (e.g., on any suitable bus 118 or otherwise) to processor subassembly 150. Second amplifier subassembly 148 may be configured to provide any suitable circuitry for biasing oscillator subassembly 140 using sensor assembly trigger data 130t that may be provided to second amplifier subassembly 148 (e.g., on any suitable bus 118 or otherwise) from processor subassembly 150. As shown in FIG. 1D, for example, in a particular embodiment, second amplifier subassembly 148 may be configured to include a voltage controlled current source 149 that may be controlled by trigger data 130t. Inductor 143 may be provided as any suitable sense coil, such as a coil that is configured to get a large amount of inductance with a limited volume, which may be accomplished by providing a large number of turns in a small area (e.g., a 2 millimeter by 2-6 millimeter coil with 1, 2, 3, or 4 layers).

Figure 2:
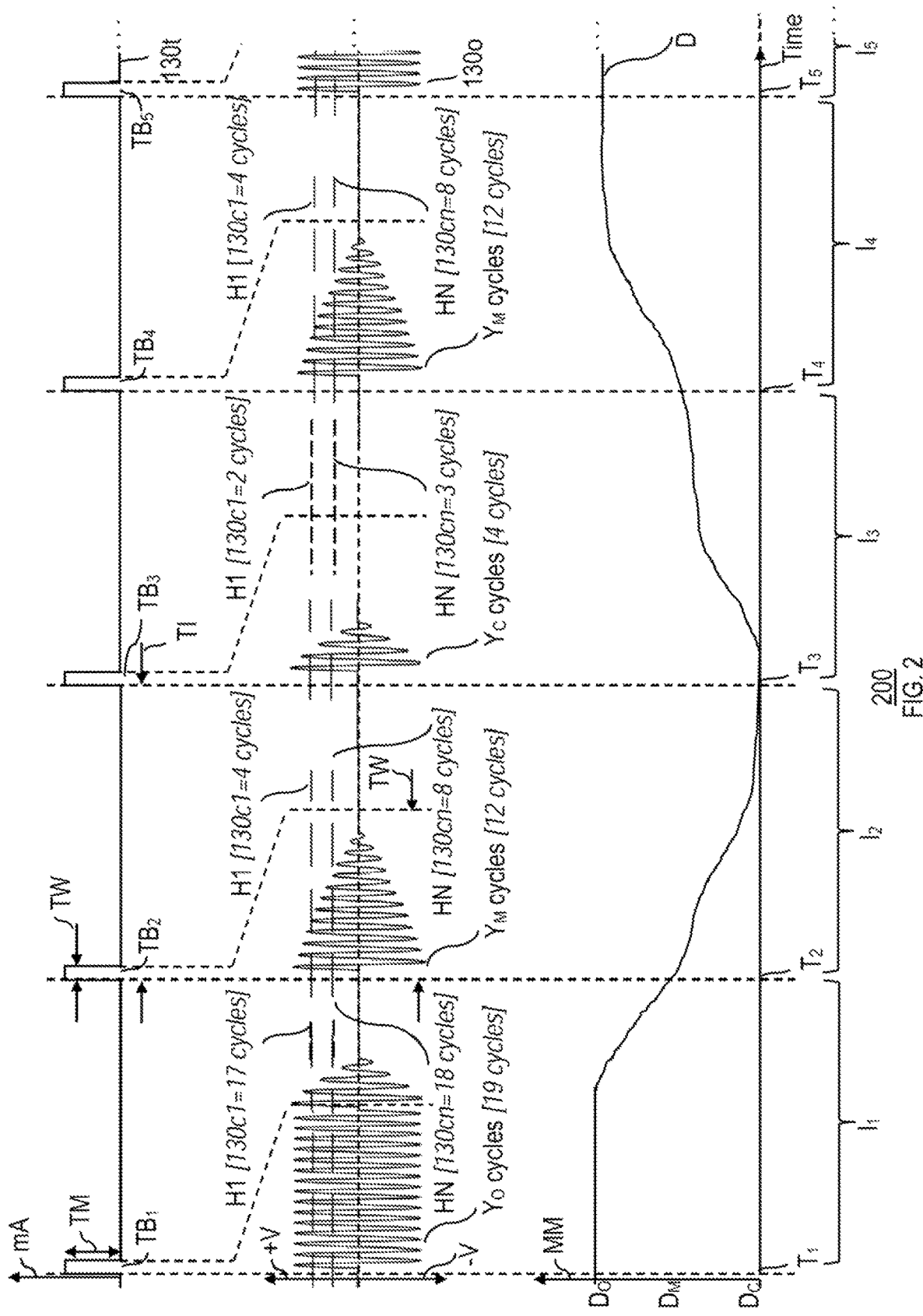
FIG. 2 is a graph illustrating exemplary behavior of various factors of a conductor sensing assembly over time, in accordance with some embodiments.

Spacing S may extend between conductor 122 and sense inductor 143, where sense inductor 143 may include a planar sense coil with any suitable number of turns that may be a single layer or multi-layer inductor, which may be patterned on a flex circuit. When such a sense coil of sense inductor 143 is within a certain proximity to a conductive plane (e.g., a conductive bottom planar surface of conductor 122), such as when the magnitude of dimension D is small (e.g., reduced to zero or substantially zero (e.g., when subassembly 142 (e.g., sense inductor 143) and conductor 122 are contacting each other) or any other suitable reduced dimension), a circuit equivalent to a transformer may be provided with the sense coil as a primary winding and the conductor as a single turn shorted secondary winding, where the primary and secondary may be coupled by a coupling coefficient k, where $0 \leq k \leq 1$, where k=0 when there is no coupling (e.g., when the magnitude of dimension D is very large (e.g., dimension $D_O$)), and where k approaches 1 when the magnitude of dimension D is reduced (e.g., close to 0 (e.g., when the magnitude of dimension D is a magnitude close to or at 0 or $D_C$ (e.g., as shown in FIG. 2))). Such a coupling coefficient k may be a function of spacing S between the sense coil of oscillator subassembly 140 and the conductive plane of conductor 122, and/or the impedance of the coupled conductor 122 may change the equivalent impedance seen at the sense coil, whereby an adjusted proximity of conductor 122 to the sense coil of oscillator subassembly 140 (e.g., to sense coil 143) may adjust the effective inductance of the sense coil. When coupling coefficient k is greater than 0, a magnetic field M produced by sense coil 143 may induce eddy currents E that may circulate in conductor 122. Such circulating eddy currents E may require power from oscillator subassembly 140 and may reduce the resonator quality factor Q of oscillator subassembly 140, which may increase the rate of decay of oscillations of oscillator subassembly 140.

Processor subassembly 150 may include a comparator subassembly 151 that may be configured to receive sensor assembly oscillation data 130$o$ (or oscillation signal and/or oscillation signal amplitude information), which may be produced by oscillator subassembly 140 when enabled by sensor assembly trigger data 130$t$ and while the magnitude of dimension D of spacing S between sense inductor 143 and conductor 122 may be adjusted. Comparator subassembly 151 may be any suitable subassembly that may be configured to compare such oscillation data 130$o$ to at least one threshold in order to detect a number of oscillation cycles whose amplitude exceeds that threshold. For example, as shown, comparator subassembly 151 may include any suitable comparator circuitry 152, such as at least a first comparator and/or N comparators, each of which may compare oscillation data 130$o$ (e.g., oscillation signal amplitude information) with a different threshold (e.g., as may be defined by different resistors or otherwise) for generating threshold event data, such as a first comparator that may compare oscillation data 130$o$ with a first threshold voltage H1 for generating first threshold event data 130$h$1 (e.g., data indicative of a pulse for every oscillation cycle detected above first threshold H1) and an Nth comparator that may compare oscillation data 130$o$ (e.g., oscillation signal amplitude information) with an Nth threshold voltage HN for generating Nth threshold event data 130$hn$ (e.g., data indicative of a pulse for every oscillation cycle detected above Nth threshold HN).

Processor subassembly 150 may also include any suitable controller subassembly 153 (e.g., a digital controller subassembly) that may be configured to count and process the number of oscillation cycles whose amplitude exceeds a particular threshold, where the determined cycle count for a particular threshold may be processed to determine a decay rate of the oscillations and/or a measure of a Q factor of oscillator subassembly 140, which may be used by controller subassembly 153 to infer the magnitude of dimension D of spacing S for generating appropriate input assembly output data 130$d$. For example, controller subassembly 153 may include any suitable counter subassembly 154 that may be configured to count the number of oscillation cycles whose amplitude exceeds a particular threshold for a particular interval of sensor assembly trigger data 130$t$ (e.g., a periodic trigger), where counter subassembly 154 may include any suitable counter circuitry 155, such as a first counter that may be operative to count the number of pulses indicated by first threshold event data 130$h$1 (e.g., during a particular trigger interval) and provide such a number as first threshold count data 130$c$1 (e.g., data indicative of the number of oscillation cycles detected above first threshold H1 during a particular trigger interval) and an Nth counter that may be operative to count the number of pulses indicated by Nth threshold event data 130$hn$ (e.g., during a particular trigger interval) and provide such a number as Nth threshold count data 130$cn$ (e.g., data indicative of the number of oscillation cycles detected above Nth threshold HN during a particular trigger interval). Controller subassembly 153 may also include any suitable logic subassembly 156 that may be configured to process one or more instances of threshold count data for one or more thresholds (e.g., for one or more particular trigger intervals) in order to determine a decay rate of the oscillations and/or a measure of a Q factor of oscillator subassembly 140 (e.g., during the one or more particular trigger intervals), which may be used by logic subassembly 156 to infer the magnitude of dimension D of spacing S (e.g., during the one or more particular trigger intervals) for generating appropriate input assembly output data 130$d$.

Logic subassembly 156 may be configured to receive or otherwise detect threshold count data (e.g., threshold count data 130$c$1 with respect to threshold H1 for each of one or more particular trigger intervals) and to access or otherwise determine oscillation count-distance correlator data 130$r$ (e.g., from any suitable correlator data source 105$a$ (e.g., memory portion 105$a$ of memory assembly 104)), and then to determine a magnitude of distance dimension D (e.g., to determine an input state of button input assembly 110$c$) based on the threshold count data 130$c$ and oscillation count-distance correlator data 130$r$ for use in generating appropriate input assembly output data 130$d$. Such operations may be repeated by logic subassembly 156 at any suitable rate for continuously monitoring the oscillation decay rate of oscillator subassembly 140 by continuously receiving updated threshold count data 130$c$ and then using that threshold count data 130$c$ with oscillation count-distance correlator data 130$r$ for continuously determining the input state of button input assembly 110$c$ and continuously re-defining input assembly output data 130$d$ accordingly.

Logic subassembly 156 may utilize threshold count data corresponding to any of N thresholds to optimize the bias level of amplifier assembly 146. Such bias optimization may be operative to adjust the amplifier gain such that the variance of the number of oscillator cycles may be maximized over the operating range of dimension D. The bias adjustments may be used to provide optimum performance as parameters change due to temperature and aging. The bias level may be defined by the amplitude of sensor assembly trigger data 130$t$ (e.g., the amplitude of a periodic trigger), whereas the oscillation trigger interval may be defined by the duration of sensor assembly trigger data 130t.

Oscillation count-distance correlator data 130r may be any suitable correlator that may be used to determine the current magnitude of distance dimension D based on certain threshold count data 130c for a particular threshold. For example, correlator data 130r may be provided by a look-up table with multiple distinct associations between a particular magnitude of a distance dimension and a particular threshold count for a particular threshold within a particular interval, such that, for example, logic subassembly 156 may be enabled to use received threshold count data 130c1 indicative of a particular number of oscillation cycles detected above threshold H1 (e.g., within a particular trigger interval) in order to identify a particular appropriate association of the look-up table of correlator data 130r, and where logic subassembly 156 may then determine the particular magnitude of distance dimension D of that identified particular association of the look-up table to be used as the current magnitude of distance dimension D of button input assembly 110c for defining input assembly output data 130d. As another example, correlator data 130r may be a polynomial curve or equation that may approximate the dependence between the magnitude of distance dimension D of button input assembly 110c and the number of oscillation cycles detected above a particular threshold for a particular trigger interval (e.g., at various magnitudes of dimension D and/or at various thresholds and/or for various trigger intervals), where logic subassembly 156 may be enabled to leverage received threshold count data in combination with such a curve or equation to identify the appropriate magnitude of dimension D to be used for identifying the current state of the button input assembly for defining appropriate input assembly output data 130d.

Any such correlator data may be defined by any suitable testing/calibrating process(es). For example, such correlator data may be defined by any suitable testing/calibration process(es) that may be carried out on sensor assembly 130 prior to incorporating sensor assembly 130 in a button input assembly, and/or may be defined by any suitable testing/calibrating process carried out on a button input assembly prior to incorporating the button input assembly into an electronic device, and/or may be defined by any suitable testing/calibrating process carried out on an electronic device after a button input assembly with a conductor sensing assembly has been incorporated into the electronic device (e.g., to take into consideration any mechanical tolerances of such a device and/or of such assemblies (e.g., stable state dimension magnitude $D_O$ and/or deflectability of conductor 122 and/or of oscillator subassembly 140 may vary from device to device and/or from assembly to assembly)). For example, such process(es) may include any suitable testing/calibrating process(es) during which a known magnitude of distance dimension D may be maintained while a number of detected oscillations above a particular threshold for a particular trigger interval may be measured and associated with that known magnitude, and during which that sub-process may be repeated one or more times after altering the known magnitude and/or the threshold and/or the trigger interval (e.g., magnitude of a trigger burst and/or length of a trigger burst and/or length of the entire trigger interval) and/or various other adjustable electrical characteristics of the assembly(ies). Any suitable oscillation count-distance correlator data 130r may be accessible by logic subassembly 156 from any suitable source (e.g., stored data from memory portion 105a of memory assembly 104 of device 100 or data accessed from a remote source remote from device 100 (e.g., as may be accessible via communications assembly 106)). For example, oscillation count-distance correlator data 130r may be at least partially determined and/or accessed by software in a microcontroller and/or by hardware based logic and/or by any other suitable digital signal processing mechanism. Depending on operating range, oscillation count-distance correlator data 130r may be indicative of a non-linear function. A tuning algorithm may be provided and utilized to adapt the oscillation count-distance correlator data, or, conversely an oscillator bias could be adaptively tuned to provide optimal performance with a fixed count.

Controller subassembly 153 may be configured to provide input assembly output data 130d that is indicative of the determined magnitude of distance dimension D (e.g., as determined based on the current decay rate of oscillator subassembly 140), and any suitable receiving element 113 of device 100 (e.g., an active application 103 of device 100) may be configured to adjust any suitable functionality of any suitable assembly of device 100 in different ways based on that input assembly output data 130d (e.g., for performing an adjustment 113a of a functionality of device 100). For example, receiving element 113 may be configured to perform a first type of adjustment 113a for decreasing the volume of audio emitted by audio speaker output assembly 112b when the distance dimension magnitude indicated by input assembly output data 130d is magnitude $D_M$ (e.g., an intermediate button press) and to perform a second type of adjustment 113a for muting the volume of audio emitted by audio speaker output assembly 112b when the distance dimension magnitude indicated by input assembly output data 130d is magnitude $D_C$ (e.g., a full button press) and to perform a third type of adjustment 113a for not adjusting the volume of audio emitted by audio speaker output assembly 112b when the distance dimension magnitude indicated by input assembly output data 130d is magnitude $D_O$ (e.g., no button press). In some embodiments, receiving element 113 may be configured to determine an adjustment 113a based on the most recently received input assembly output data 130d (e.g., the input assembly output data 130d generated for a most recent trigger interval). Alternatively, in some embodiments, receiving element 113 may be configured to determine an adjustment 113a based on the most recently received input assembly output data 130d (e.g., the input assembly output data 130d generated for a most recent trigger interval) and one or more previously received instances of input assembly output data 130d (e.g., the input assembly output data 130d generated for one or more trigger intervals that occurred prior to the most recent trigger interval), for example, such that a running average or any other suitable statistical calculation may be made when processing input assembly output data 130d for generating a particular adjustment 113a (e.g., for muting the volume of audio emitted by audio speaker output assembly 112b when the distance dimension magnitude indicated by input assembly output data 130d is magnitude $D_C$ (e.g., a full button press) for at least five (5) consecutive instances of input assembly output data 130d).

Controller subassembly 153 may also include any suitable timer subassembly 157 that may be configured to generate and transmit sensor assembly trigger data 130t (e.g., periodic trigger burst at any suitable trigger interval) to oscillator subassembly 140 (e.g., in conjunction with logic subassembly 156), whereby a magnitude and length of a trigger burst window and a length of an entire periodic trigger interval between the initiation of each periodic trigger burst window may be electronically controlled by timer subassembly 157 and/or logic subassembly 156 and/or any other suitable assembly of device 100. For example, timer subassembly 157 may be based on any suitable oscillator and counter that may count time (e.g., with a constant interval), which may trigger measurement at a suitable sample rate/period, while logic subassembly 156 may be woken up by the same timer. Logic subassembly 156 may be configured to count the number of cycles exceeding each of the N thresholds during the interval when the trigger (e.g., from the timer) is active. After a delay following the end (e.g., falling edge) of the trigger, the count data may be stored, where such a delay may be configured to allow for oscillator decay after the trigger turns off (e.g., a simple embodiment may be configured such that the count interval may be twice the trigger width (TW)). The count data may go through any suitable processing (e.g., any suitable digital processing algorithm(s)) to compute input assembly output data 130d corresponding to spacing D. Other suitable processing (e.g., other suitable digital processing algorithm(s)) may be configured to compute an adjustment to the amplitude of sensor assembly trigger data 130t (e.g., to optimize the bias of the oscillator's amplifier block). Therefore, if the bursts decay too quickly, the bias may be bumped upwards, and, if the bursts decay too slowly, the bias may be bumped downwards.

FIG. 2 is a graph 200 illustrating exemplary behavior of various factors of a conductor sensing assembly over time, in accordance with some embodiments. For example, as shown, graph 200 may show exemplary behavior of each one of sensor assembly trigger data 130t, sensor assembly oscillation data 130o, and magnitude of dimension D of spacing S of button input assembly 110c over any suitable period of time, which may include a first time period between time $T_1$ and time $T_2$ that may span a first trigger period or trigger interval $I_1$ of trigger data 130t, a second time period between time $T_2$ and time $T_3$ that may span a second trigger period or trigger interval $I_2$ of trigger data 130t, a third time period between time $T_3$ and time $T_4$ that may span a third trigger period or trigger interval $I_3$ of trigger data 130t, a fourth time period between time $T_4$ and time $T_5$ that may span a fourth trigger period or trigger interval $I_4$ of trigger data 130t, and a portion of a fifth time period that starts at time $T_5$ that may span a fifth trigger period or trigger interval $I_5$ of trigger data 130t.

As shown, graph 200 may include an illustration of exemplary behavior of sensor assembly trigger data 130t over time. Trigger data 130t may be configured to include a periodic trigger that may be defined by a periodic trigger burst window. For example, as shown, trigger data 130t may be operative to define a first trigger burst window $TB_1$ during first trigger interval $I_1$, a second trigger burst window $TB_2$ during second trigger interval $I_2$, a third trigger burst window $TB_3$ during third trigger interval $I_3$, a fourth trigger burst window $TB_4$ during fourth trigger interval $I_4$, and a fifth trigger burst window $TB_5$ during fifth trigger interval $I_5$. Each trigger burst window may be configured to be defined by any suitable trigger burst window magnitude TM for any suitable trigger burst window width TW, which may be any suitable percentage of any suitable periodic trigger interval width TI that may define the length of time of a trigger interval between the initiation of consecutive trigger burst windows (e.g., of consecutive trigger intervals). For example, trigger burst window width TW may be any suitable length of time, such as about 2.5 microseconds or may be in any suitable range, such as between 1 microsecond and 20 microseconds, while trigger interval width TI may be any suitable length of time, such as about 50 milliseconds or may be in any suitable range, such as between 10 milliseconds and 100 milliseconds, while trigger burst window magnitude TM may define an amplitude bias current in any suitable range, such as between 1 and 8 milliAmperes. The overall power consumption of oscillator subassembly 140 may be reduced by its duty factor of operation (e.g., active time of trigger burst window width TW divided by trigger interval width TI). As just one particular embodiment, when trigger burst window width TW may be 2.5 microseconds and when trigger interval width TI may be 50 milliseconds and when trigger burst window magnitude TM may define an amplifier bias of 4 milliAmperes, the overall power consumed (e.g., at 3.8 V supply voltage) may be 0.76 microWatts (e.g., 3.8 V supply voltage*4.0 milliAmperes amplifier bias current*2.5 microseconds trigger burst window/50 milliseconds trigger interval=0.76 microWatts).

Oscillator subassembly 140 may be enabled by such a periodic trigger of trigger data 130t, which may turn on a bias current to the oscillator for a fixed time (e.g., the length of time of trigger burst window width TW every periodic trigger cycle). The oscillator bias current may be tuned to a level that may be sufficient to support resonator oscillation when conductor 122 is spaced at a maximum (e.g., resting state) distance dimension magnitude $D_O$ of spacing S from the oscillator (e.g., from sense coil 143). For example, as shown in FIG. 2, when button input assembly 110c may be at a resting static state where distance dimension D of spacing S between conductor 122 and sense coil 143 may be of a (e.g., maximum or open) magnitude $D_O$ during first trigger interval $I_1$, the oscillator of oscillator subassembly 140 may be configured to produce a burst of $Y_O$ (e.g., a maximum number of) oscillation cycles when enabled by first trigger burst window $TB_1$ during first trigger interval $I_1$, where the number $Y_O$ (e.g., 19 cycles as shown in FIG. 2) may be dependent on the magnitude of the trigger burst window width TW of first trigger burst window $TB_1$ and/or the resonant frequency of the oscillator (e.g., the inductance of sense coil 143 of the oscillator (e.g., ~90 nH (e.g., 43 MHz resonant frequency) when dimension D is of open magnitude $D_O$)) and/or on any other suitable characteristics of sensor assembly 130. It is to be understood that cycle count number $Y_O$ may be any suitable number other than 19 for any suitable configuration of sensor assembly 130, such as 100 cycles or any other suitable number. For example, a particular target sensor sample rate may be chosen based on any requirements of the system (e.g., where lower sample rates (e.g., ~1 Hertz) may have lower power with higher latency, while higher sample rates (e.g., ~100 Hertz) may have higher power with lower latency). Then, the system may be configured to ensure that the number of cycles may not last so long as to extend beyond the period defined by the sample rate. The number of cycles may depend, in part, on the resonant frequency (e.g., at 43 MHz, as above, the system may get at or about 100 cycles in a 2.5 µs trigger window). A start-up delay may exist at the oscillator so the number of cycles may be less. It may be desired to get enough cycles to yield a set of numbers from the threshold comparators that may allow some resolution in detecting the gap dimension D and/or that may allow for drift of parameters over temperature and/or aging. For example, in some embodiments of the system, 4 cycles may be too few and more than 100 cycles may be too many (e.g., resulting in a waste of power). In the open state, the amplifier bias current may be adjusted to be just enough to support oscillation through the burst window. Any decrease in Q (e.g., due to conductor moving closer to sense coil) may reduce the cycle count. If the bias is too high, then the oscillator may oscillate throughout the burst window even as the Q factor decreases. With bias set appropriately, the count may decrease for the travel (e.g., change in spacing) of the conductor.

When the magnitude of distance dimension D of spacing S between conductor 122 and sense inductor 143 has been reduced from magnitude $D_O$ to magnitude $D_M$, as shown in graph 200, between time $T_1$ and time $T_2$ that may span first trigger interval $I_1$, the Q factor of oscillator subassembly 140 may be reduced (e.g., due to increased eddy current losses in conductor 122), whereby the oscillator output amplitude of sensor assembly oscillation data 130$o$ may decay more rapidly, for example, whereby the oscillator of oscillator subassembly 140 may be configured to produce a burst of $Y_M$ oscillation cycles when enabled by second trigger burst window $TB_2$ following first trigger interval $I_1$, where the number $Y_M$ (e.g., 12 cycles as shown in FIG. 2) may be less than the maximum number $Y_O$. Moreover, when the magnitude of distance dimension D of spacing S between conductor 122 and sense inductor 143 has been further reduced from magnitude $D_M$ to magnitude $D_C$, as shown in graph 200 between time $T_2$ and time $T_3$ that may span second trigger interval $I_2$, the Q factor of oscillator subassembly 140 may be further reduced, whereby the oscillator output amplitude of sensor assembly oscillation data 130$o$ may decay even more rapidly (e.g., at a maximum rate). As a result, the oscillator of oscillator subassembly 140 may produce a burst of $Y_C$ oscillation cycles when enabled by third trigger burst window $TB_3$ following second trigger interval $I_2$, where the number $Y_C$ (e.g., 4 cycles as shown in FIG. 2) may be even less than the number $Y_M$ (e.g., number $Y_C$ may be a minimum number of cycles due to the minimized magnitude of dimension D of spacing S). When the magnitude of distance dimension D has been increased from magnitude $D_C$ to magnitude $D_M$, as shown in graph 200 between time $T_3$ and time $T_4$ that may span third trigger interval $I_3$, the Q factor of oscillator subassembly 140 may increase. As a result, the oscillator output amplitude of sensor assembly oscillation data 130$o$ may decay less rapidly, which may produce a burst of $Y_M$ oscillation cycles when enabled by fourth trigger burst window $TB_4$ during fourth trigger interval $I_4$. When the magnitude of distance dimension D has been increased from magnitude $D_M$ to magnitude $D_O$, as shown in graph 200 between time $T_4$ and time $T_5$ spanning fourth trigger interval $I_4$, the Q factor of oscillator subassembly 140 may increase, whereby the resulting oscillator output amplitude of sensor assembly oscillation data 130$o$ may decay even less rapidly (e.g., at a minimum rate), which may produce a burst of $Y_O$ oscillation cycles when enabled by fifth trigger burst window $TB_5$ during fifth trigger interval $I_5$.

The oscillator of oscillator subassembly 140 may be enabled by a trigger burst window of a trigger interval to produce a burst of oscillation cycles that may fully decay prior to the end of the trigger burst window or shortly thereafter. Power may be consumed by the oscillator only during the trigger burst window of each trigger interval, whereby for a trigger interval of 100 milliseconds with a trigger burst window of only 1 microsecond, the duty factor of the active power may be 0.00001 and an overall power consumption of less than 1 microWatt may be required on average. As shown in FIG. 2, oscillation may begin when trigger signal 130$t$ is active (high). If the Q is low enough, the oscillation may decay before trigger signal 130$t$ goes low. For high Q, the oscillator amplitude may be high throughout the active interval of trigger signal 130$t$ and may decay after trigger signal 130$t$ goes low. As shown in FIG. 2, trigger burst window width TW may correspond to the interval with stable amplitude in the first burst. If the bias current is high enough, or the conductor is far enough away, the oscillation may be sustained throughout the entire trigger burst window and may decay only after the bias is turned off at the end of the trigger burst window. In such an event, there may be no power consumed (e.g., from the power supply) as the oscillation decays (e.g., stored energy in the resonator may dissipate in the resistances of the sense coil and due to the eddy current losses in the conductor). Even though the decay may be happening after the burst window, the power duty factor may be the same (e.g., power may be consumed only when the bias current is on). However, it is to be noted that, if the conductor is spaced infinitely far away from the inductor, there may be no eddy current losses, but the oscillation may decay over time due to losses (e.g., resistance) in the resonator elements. Based on a practical Q of a sensor (e.g., an inverse function of resistance), it may be likely for oscillation to decay within a sample period. This may be based, at least in part, on the design of the LC circuit and any losses (e.g., R) and/or the time between samples. By reducing or minimizing the amount of time during which certain control logic may be active, power consumption may be reduced or minimized.

Therefore, a button input assembly with a conductor sensor may be configured such that the oscillator may oscillate throughout an entire trigger burst window of a trigger interval (e.g., an LC resonator may be pulsed or biased with enough energy so that it oscillates through the entire burst window) when a conductor is spaced at a distance dimension D of magnitude $D_O$ from the oscillator, but, when the magnitude of such a spacing dimension is reduced, energy may be lost due to eddy currents induced in the conductor. The button input assembly may be configured such that there may not be energy sufficient to maintain oscillation throughout an entire burst window as the losses increase the oscillation decay becomes faster. Rather than measuring the change in inductance of an oscillator subassembly, it may be easier and/or more efficient and/or more effective to measure the energy loss of an oscillator subassembly. By measuring how fast oscillation energy may die out or decay or dampen, the magnitude of the distance dimension between the oscillator and the conductor may be calculated (e.g., very small changes in such a magnitude of such a distance dimension may be detected (e.g., small deflections (e.g., deflections on the order of 10 micrometers or even on the order of less than 1 micrometer) may be detected through such an approach).

As mentioned, the oscillations of oscillation data 130$o$ output by oscillation subassembly 140 may be compared to one or more thresholds (e.g., one or more threshold voltages, such as threshold H1 and/or threshold FIN) by processor subassembly 150 (e.g., by comparator subassembly 151) to create one or more types of threshold count data (e.g., one or more digital pulse streams) that may be indicative of oscillator cycles whose amplitude exceeds a particular threshold, such as first threshold event data 130$h$1 (e.g., data indicative of a pulse for every oscillation cycle detected above first threshold H1) and/or N threshold event data 130$hn$ (e.g., data indicative of a pulse for every oscillation cycle detected above N threshold HN). Moreover, processor subassembly 150 (e.g., counter subassembly 154) may be operative to count (e.g., provide counters that record and share) the number of oscillation cycles detected to be exceeding the amplitude threshold of a particular threshold, such as by generating first threshold count data 130$c$1 (e.g., data indicative of the number of oscillation cycles detected above first threshold H1 during a particular trigger interval) and/or N threshold count data 130$cn$ (e.g., data indicative of the number of oscillation cycles detected above N threshold FIN during a particular trigger interval), each of which may be indicative of any suitable number of cycles for a particular trigger interval that may be between 0 cycles or any suitable minimum number of cycles and a maximum count number $Y_O$ of cycles (e.g., 19 cycles as shown in FIG. 2 or any other suitable maximum oscillation cycle number). For example, as shown in FIG. 2, first threshold H1 may be a higher threshold than N threshold HN, yet each threshold may be any suitable value. As shown, first threshold count data 130$c$1 may be detected to be 17 cycles of the total 19 $Y_O$ oscillation cycles that may be produced within first trigger burst window $TB_1$ of first trigger interval $I_1$ when distance D is of an open magnitude $D_O$, while N threshold count data 130$c$N may be detected to be 18 cycles within the same trigger burst window. First threshold count data 130$c$1 may be detected to be 4 cycles of the total 12 $Y_M$ oscillation cycles that may be produced within second trigger burst window $TB_2$ of second trigger interval $I_2$ when distance D is of a mid-magnitude $D_M$, while N threshold count data 130$c$N may be detected to be 8 cycles within the same trigger burst window. First threshold count data 130$c$1 may be detected to be 2 cycles of the total 4 $Y_C$ oscillation cycles that may be produced within third trigger burst window $TB_3$ of third trigger interval $I_3$ when distance D is of a closed magnitude $D_C$, while N threshold count data 130$c$N may be detected to be 3 cycles within the same trigger burst window. First threshold count data 130$c$1 may be detected to be 4 cycles of the total 12 $Y_M$ oscillation cycles that may be produced within fourth trigger burst window $TB_4$ of fourth trigger interval $I_4$ when distance D is of mid-magnitude $D_M$, while N threshold count data 130$c$N may be detected to be 8 cycles within the same trigger burst window. Then, processor subassembly 150 (e.g., logic subassembly 156) may be operative to process such threshold count data for one or more particular thresholds and/or for one or more particular trigger intervals in combination with any suitable oscillation count distance correlator data 130$r$, such as any suitable look up table date or digital threshold data and/or the like, to determine appropriate input assembly output data 130$d$ that may be indicative of the magnitude of distance dimension D and/or otherwise of the input state of input assembly 110$c$ (e.g., a solid state button or a substantially solid state button with minimal travel (e.g., a minimal travel distance $D_O$ (e.g., 250 micrometers or less)) or any other suitable type of button with an adjustable distance between an oscillator and a conductor). Therefore, any oscillator cycle count may be indicative of decay rate and may be a measure of resonator Q that can be used to infer a magnitude of dimension D of spacing S for the sensor assembly and conductor.

It is to be understood that, graph 200 of FIG. 2 is meant to be illustrative of certain features of sensor assembly 130 and input assembly 110$c$ but, in certain embodiments, unlike as shown in FIG. 2, more than one trigger interval may occur before the magnitude of distance dimension D is able to be changed from magnitude $D_O$ to magnitude $D_M$ or from magnitude $D_M$ to magnitude $D_C$ or from magnitude $D_C$ to magnitude $D_M$ or from magnitude $D_M$ to magnitude $D_O$. For example, the length of each trigger interval may be much quicker than the length of time that may be needed for a user to move conductor 122 and the oscillator of oscillator subassembly 140 with respect to one another by a magnitude equal to the difference between magnitude $D_O$ and $D_M$ and/or by a magnitude equal to the difference between magnitude $D_C$ and $D_M$. A trigger interval may be set to sample more quickly than any possible input component manipulation frequency by an end user (e.g., 100 times in a second). More than one threshold may be used to determine force, which may enable the button to be usable as a multi-level button, where different presses of different magnitudes may be differentiated and used to result in different functionality adjustments. Additionally or alternatively, more than one threshold may be used in certain calibration schemes, for example, when a wandering drift and/or offset may exist, where a threshold may be changed due to environment and/or aging of the system. Various characteristics of sensor assembly 130 and/or of input assembly 110$c$ may be designed to provide certain functionality. For example, an oscillator bias current amplitude of oscillator subassembly 140 and/or one or more comparator thresholds may be set (e.g., through any suitable testing and/or calibration process(es) (e.g., any suitable auto calibration process(es))) to provide the largest change in counter value according to the range of motion of conductor 122 with respect to sense coil 143 (e.g., according to magnitude $D_O$ of the range of dimension D of spacing S). As described earlier, to achieve effective detection, the oscillator bias current may be reduced to a minimum level needed to sustain oscillation through the trigger burst window when the spacing is large (e.g., at its maximum (e.g., magnitude $D_O$)). If this is done, the oscillator bias may provide just enough energy to overcome losses due to resistances within the oscillator itself. A calibration routine may be configured to adjust the bias in such a fashion during a time interval when the switch is in the "open" state. When the bias is set this way, any additional loss due to the eddy currents induced as the conductor moves to a closer position may cause the oscillations to collapse as the Q decreases. Therefore, it may be useful to do an initial bias calibration when the switch is known to be in an open position (e.g., such an initial calibration may be done at assembly of the system in the factory). Afterwards, the bias calibration can be updated when the reported count is near the maximum, which may be indicative of the open state. The optimal threshold(s) may depend on the shape of the decay envelope. In some embodiments, multiple comparators and thresholds may be provided by the circuitry and the best one may be selected for use after the unit has been assembled. Maximizing or increasing a change in counter value for a given button press may be indicative of achieving a maximum or increased amount of Q change, which may depend on material of the moving conductor, its spacing from the coil, the cross-sectional area (e.g., diameter) of the coil, and/or the baseline open inductance of the coil. Higher Q inductor layouts may perform better or more effectively or more reliably. Measurement of the Q of a tank circuit utilizing a sensing coil may allow for such a simple counter-based detection scheme. Low throw designs may require certain processing capabilities (e.g., digital processing) to track the history of the detected excursions to properly set a detection threshold.

Figure 3:
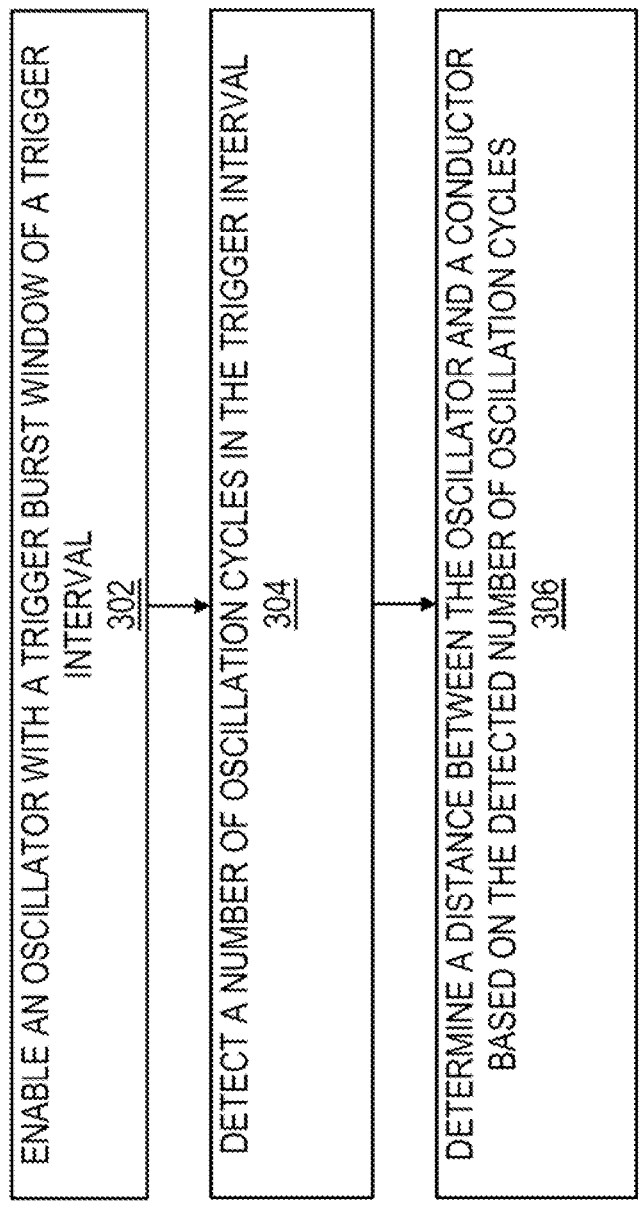

FIG. 3 is a flowchart of an illustrative process 300 for sensing a conductor using an oscillator. At operation 302 of process 300, the oscillator may be enabled with a trigger burst window within a trigger interval (e.g., an oscillator of oscillator subassembly 140 may be enabled by a trigger burst window TB of a trigger interval I). At operation 304 of process 300, a number of oscillation cycles (e.g., as generated by the oscillator as enabled at operation 302) may be detected in the trigger interval (e.g., a number of oscillation cycles may be detected by threshold count data 130$c$ during a trigger interval I). At operation 306 of process 300, a distance between the conductor and a portion of the oscillator (e.g., a sense coil) may be determined based on the detected number of oscillation cycles (e.g., a magnitude of distance dimension D between conductor 122 and the inductor of oscillator subassembly 140 may be determined based on threshold count data 130c).

It is understood that the operations shown in process 300 of FIG. 3 are only illustrative and that existing operations may be modified or omitted, additional operations may be added, and the order of certain operations may be altered.

FIG. 4 is a flowchart of an illustrative process 400 for sensing a conductor using an oscillator. At operation 402 of process 400, the oscillator may be enabled with a trigger (e.g., an oscillator of oscillator subassembly 140 may be enabled by a trigger burst window TB of a trigger interval I). At operation 404 of process 400, a decay rate of oscillations of the oscillator when enabled may be detected (e.g., during a trigger interval I). At operation 406 of process 400, a distance between the conductor and a sense coil of the oscillator may be determined based on the detected decay rate (e.g., a magnitude of distance dimension D between conductor 122 and the inductor of oscillator subassembly 140 may be determined).

It is understood that the operations shown in process 400 of FIG. 4 are only illustrative and that existing operations may be modified or omitted, additional operations may be added, and the order of certain operations may be altered.

One, some, or all of the processes described with respect to FIGS. 1-4 may each be implemented by software, but may also be implemented in hardware, firmware, or any combination of software, hardware, and firmware. Instructions for performing these processes may also be embodied as machine- or computer-readable code recorded on a machine- or computer-readable medium. In some embodiments, the computer-readable medium may be a non-transitory computer-readable medium. Examples of such a non-transitory computer-readable medium include but are not limited to a read-only memory, a random-access memory, a flash memory, a compact disc (e.g., compact disc ("CD")-ROM), a digital versatile disk ("DVD"), a magnetic tape, a removable memory card, and a data storage device (e.g., memory assembly 104 of FIG. 1). In other embodiments, the computer-readable medium may be a transitory computer-readable medium. In such embodiments, the transitory computer-readable medium can be distributed over network-coupled computer systems so that the computer-readable code is stored and executed in a distributed fashion. For example, such a transitory computer-readable medium may be communicated from one electronic device to another electronic device using any suitable communications protocol (e.g., the computer-readable medium may be communicated from a remote device or server to electronic device 100 via communications assembly 106 (e.g., as at least a portion of an application 103)). Such a transitory computer-readable medium may embody computer-readable code, instructions, data structures, program modules, or other data in a modulated data signal, such as a carrier wave or other transport mechanism, and may include any information delivery media. A modulated data signal may be a signal that has one or more of its characteristics set or changed in such a manner as to encode information in the signal.

It is to be understood that any, each, or at least one module or component or element or subsystem of device 100 may be provided as a software construct, firmware construct, one or more hardware components, or a combination thereof. For example, any, each, or at least one module or component or element or subsystem of device 100 may be described in the general context of computer-executable instructions, such as program modules, that may be executed by one or more computers or other devices. Generally, a program module may include one or more routines, programs, objects, components, and/or data structures that may perform one or more particular tasks or that may implement one or more particular abstract data types. It is also to be understood that the number, configuration, functionality, and interconnection of the modules and components and elements and subsystems of device 100 are only illustrative, and that the number, configuration, functionality, and interconnection of existing modules, components, elements, and/or subsystems of device 100 may be modified or omitted, additional modules, components, elements, and/or subsystems of device 100 may be added, and the interconnection of certain modules, components, elements, and/or subsystems of device 100 may be altered.

At least a portion of one or more of the modules or components or elements or subsystems of device 100 may be stored in or otherwise accessible to an entity of system 1 in any suitable manner (e.g., in memory assembly 104 of device 100 (e.g., as at least a portion of an application 103)). Any or all of the modules or other components of device 100 may be mounted on an expansion card, mounted directly on a system motherboard, or integrated into a system chipset component (e.g., into a "north bridge" chip).

Any or each module or component of device 100 may be a dedicated system implemented using one or more expansion cards adapted for various bus standards. For example, all of the modules may be mounted on different interconnected expansion cards or all of the modules may be mounted on one expansion card.

While there have been described systems, methods, and computer-readable media for detecting movement of a conductor, it is to be understood that many changes may be made therein without departing from the spirit and scope of the subject matter described herein in any way. Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

Therefore, those skilled in the art will appreciate that the concepts of the disclosure can be practiced by other than the described embodiments, which are presented for purposes of illustration rather than of limitation.

What is claimed is:

1. A method of sensing a conductor using an oscillator, the method comprising:

enabling the oscillator with a trigger burst during a trigger burst window of a periodic trigger interval;

generating first threshold count data indicative of the number of oscillations of the oscillator exceeding a first amplitude threshold during the periodic trigger interval;

generating second threshold count data indicative of the number of oscillations of the oscillator exceeding a second amplitude threshold during the periodic trigger interval, wherein the second amplitude threshold is different than the first amplitude threshold; and determining a distance between the conductor and a sense coil of the oscillator based on the generated first and second threshold count data.

2. The method of claim 1, further comprising adjusting a functionality of an electronic device based on the determined distance.

3. The method of claim 2, wherein the conductor is a portion of a housing of the electronic device.

4. The method of claim 2, wherein the conductor is operative to be movable with respect to the sense coil of the oscillator by an end user of the electronic device.

5. The method of claim 4, wherein one of the sense coil or the conductor is a portion of a housing of the electronic device.

6. The method of claim 1, further comprising:
after the enabling, re-enabling the oscillator;
detecting a number of oscillation cycles generated by the re-enabling; and
determining a type of movement of the conductor with respect to the sense coil based on the detected number.

7. The method of claim 6, further comprising adjusting a functionality of an electronic device based on the determined type of movement.

8. The method of claim 7, wherein the conductor is a portion of a housing of the electronic device.

9. The method of claim 7, wherein the conductor is operative to be movable with respect to the sense coil by an end user of the electronic device.

10. The method of claim 1, wherein the determining comprises accessing a particular correlator that defines a relationship between at least the generated first threshold count data and the distance between the conductor and the sense coil.

11. The method of claim 1, wherein the conductor is operative to be movable with respect to the oscillator by an end user of the electronic device.

12. The method of claim 1, wherein the sense coil is a portion of a housing of the electronic device.

13. A method of sensing a conductor using an oscillator, the method comprising:
enabling the oscillator with a trigger;
detecting a decay rate of oscillations of the oscillator when enabled;
determining a distance between the conductor and a sense coil of the oscillator based on the detected decay rate; and
setting a bias of the trigger to a minimum level required to sustain oscillations of the oscillator through the trigger when the conductor does not affect a decay rate of oscillations of the oscillator.

14. A method of sensing a conductor using an oscillator, the method comprising:
enabling the oscillator with a trigger burst during a trigger burst window of a periodic trigger interval;
detecting a first number of oscillation cycles during the trigger burst window whose amplitude exceeds a first threshold;
detecting a second number of oscillation cycles during the trigger burst window whose amplitude exceeds a second threshold that is different than the first threshold; and
determining a distance between the conductor and the oscillator based on the detected first and second numbers.

15. The method of claim 14, further comprising adjusting a functionality of an electronic device based on the determined distance.

16. The method of claim 15, wherein the conductor is a portion of a housing of the electronic device.

17. The method of claim 15, wherein the conductor is operative to be movable with respect to the oscillator by an end user of the electronic device.

18. The method of claim 17, wherein the conductor is a portion of a housing of the electronic device.

19. The method of claim 14, further comprising:
after the enabling, further enabling the oscillator with another trigger burst window of another trigger interval that follows the trigger interval;
detecting a third number of oscillation cycles in the other trigger burst window; and
determining a type of movement of the conductor with respect to the oscillator based on the detected first, second, and third numbers.

20. The method of claim 19, further comprising adjusting a functionality of an electronic device based on the determined type of movement.

21. The method of claim 20, wherein the conductor is a portion of a housing of the electronic device.

22. The method of claim 20, wherein the conductor is operative to be movable with respect to the oscillator by an end user of the electronic device.

23. The method of claim 14, wherein the determining comprises accessing a particular correlator that defines a relationship between the detected first number of oscillation cycles and the distance between the conductor and the oscillator.

24. The method of claim 14, wherein the determining the distance comprises determining the distance between the conductor and a sense coil of the oscillator based on the detected first and second number.

25. The method of claim 24, wherein the conductor is operative to be movable with respect to the sense coil by an end user of an electronic device.

26. The method of claim 25, wherein the sense coil is a portion of a housing of the electronic device.

* * * * *